United States Patent [19]
Spaeth et al.

[11] Patent Number: 5,654,559
[45] Date of Patent: Aug. 5, 1997

[54] OPTICAL COUPLING DEVICE AND METHOD FOR MANUFACTURING THE SAME

[75] Inventors: Werner Spaeth, Holzkirchen; Norbert Stath, Regensburg; Ernst Nirschl, Wenzenbach; Walter Wegleiter, Nittendorf; Werner Kuhlmann; Rudolf Buchberger, both of Munich, all of Germany

[73] Assignee: Siemens Aktiengesellschaft, Munich, Germany

[21] Appl. No.: 637,581

[22] Filed: Apr. 25, 1996

Related U.S. Application Data

[63] Continuation of Ser. No. 310,868, Sep. 23, 1994, abandoned

[30] Foreign Application Priority Data

Sep. 23, 1993 [DE] Germany ............... 43 32 449.5

[51] Int. Cl.⁶ ............................................. H01L 31/167
[52] U.S. Cl. ................... 257/82; 257/80; 257/462; 250/551
[58] Field of Search ...................... 257/80–85, 462; 250/551

[56] References Cited

U.S. PATENT DOCUMENTS

| | | | |
|---|---|---|---|
| 3,925,801 | 12/1975 | Haitz et al. | 257/82 |
| 4,551,629 | 11/1985 | Carson et al. | 250/578 |
| 4,712,017 | 12/1987 | Kamasaki | 257/82 |
| 4,755,474 | 7/1988 | Moyer | 437/3 |
| 4,851,695 | 7/1989 | Stein | 250/551 |
| 4,857,746 | 8/1989 | Kuhlmann et al. | 250/551 |
| 4,888,625 | 12/1989 | Mueller | 357/17 |
| 5,347,162 | 9/1994 | Pasch | 257/773 |

FOREIGN PATENT DOCUMENTS

| | | | |
|---|---|---|---|
| 1639414 | 2/1971 | Germany . | |
| 1 639 414 | 2/1971 | Germany . | |
| 3713067A1 | 4/1987 | Germany . | |
| 3633251A1 | 3/1988 | Germany . | |
| 59-94476 | 5/1984 | Japan | 257/83 |
| 59-177978 | 10/1984 | Japan | 257/82 |
| 62-252178 | 11/1987 | Japan . | |
| 1-27276 | 1/1989 | Japan | 257/82 |
| 1-61966 | 3/1989 | Japan | 257/84 |
| 1-128478 | 5/1989 | Japan | 257/82 |

*Primary Examiner*—Jerome Jackson, Jr.
*Assistant Examiner*—John Guay
*Attorney, Agent, or Firm*—Hill, Steadman & Simpson

[57] ABSTRACT

An optical coupling device and method for manufacturing the same is disclosed wherein a light-emitting semiconductor transmitter chip is secured to a light-detecting semiconductor receiver chip via a transparent insulating layer, a structured spacer layer and a transparent connecting layer. The resultant optocoupler has a high coupling factor and may be reliably manufactured into SMT compatible packages.

11 Claims, 1 Drawing Sheet

OPTICAL COUPLING DEVICE AND METHOD FOR MANUFACTURING THE SAME

This is a continuation, of application Ser. No. 08/310,868 filed Sep. 23, 1994, now abandoned.

BACKGROUND OF THE INVENTION

1. Field of the Invention

The present invention relates to an optical coupling device or optocoupler and, more particularly, the present invention relates to an optical coupling device having a high coupling factor which is both physically small and which may also be reliably manufactured.

2. Description of the Related Art

Optical coupling devices or optocouplers are generally known in the art and are used where it is desired to maintain electrical isolation between two circuits. Optical coupling and the resultant electrical isolation allows reaction free and potential-free signal transmission between two circuits and decreases noise in the signals transmitted between the circuits.

Optical couplers typically are comprised of a light-emitting semiconductor device which operates as the optical transmitter and a light-detecting semiconductor device which functions as the optical receiver. The optical transmitter and receiver are usually integrated into a single housing and are electrically isolated from each other. In a typical optical coupling device, a light-emitting diode (LED or IRED) that emits light in the visible or infrared wavelength range is employed as the optical transmitter and a photodiode or photo-transistor operates as the optical receiver. A GaAs IRED combined with a Si phototransistor is a standard combination as these devices may be easily tuned to each other. This is due to the fact that the maximum emission of the gallium arsenide diode nearly coincides with the highest spectral sensitivity of the silicon transistor. Optocouplers provide numerous advantages over mechanical relays, including, the elimination of all moving parts, long service life, small size, compatibility with semiconductor circuits and, most significantly, their high switching frequency.

Various optical coupling devices are known in the art. One such optical coupler is disclosed in German patent application No. 37 13 067 wherein a transmitter chip and a receiver chip are firmly joined to one another via an optical coupling medium. The coupling medium acts as an insulating transparent intermediate layer. The transmitter chip, coupling medium and receiver chip are directly connected to one another and are in fact layered on top of one another.

German Patent Application No. 36 33 251 discloses an optocoupler wherein an optical transmitter chip and an optical receiver chip are directly connected to one another via a coupling medium comprised of a transparent adhesive or glass solder. Fiber glass sections or glass balls can be added to this coupling medium as transparent spacer particles.

SUMMARY OF THE INVENTION

The present invention improves upon the prior art optocouplers and provides a technical advance by providing an optical coupler having a high coupling factor which may be reliably manufactured and which has low space requirements. The novel structure allows the optocoupler to be manufactured in a housing that is suitable for use with SMT (Surface Mount Technology) structures.

Additional features and advantages of the present invention are described in, and will be apparent from, the detailed description of the presently preferred embodiments and from the drawing.

BRIEF DESCRIPTION OF THE DRAWINGS

The Figure illustrates a cross-sectional view of an exemplary embodiment of the optocoupler of the present invention.

DETAILED DESCRIPTION OF THE PRESENTLY PREFERRED EMBODIMENTS

Figure 1:
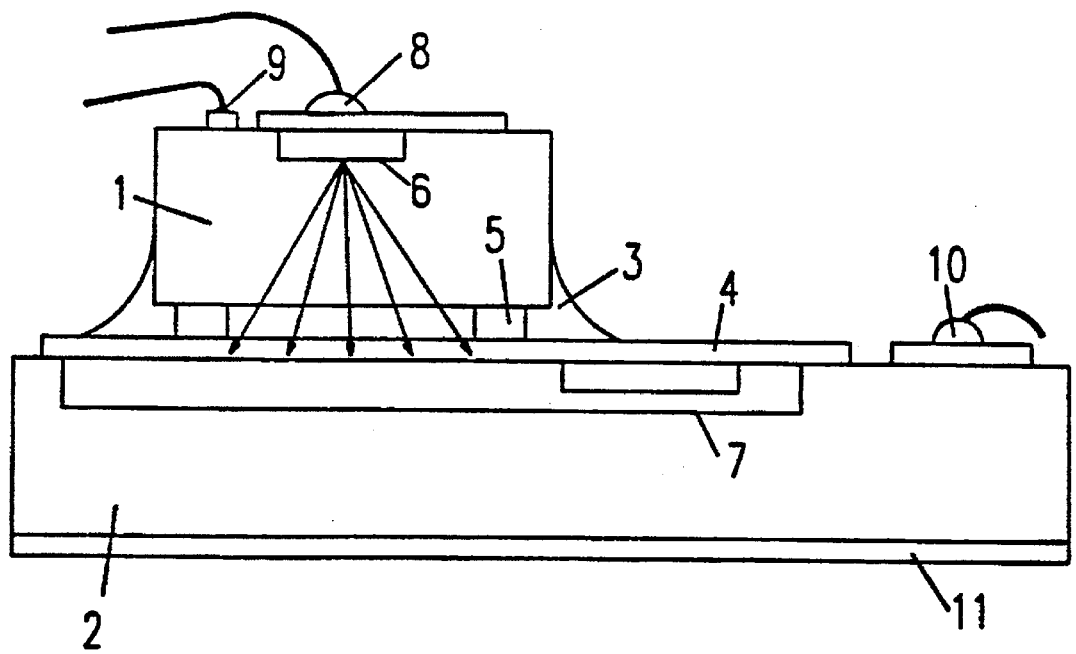

The Figure illustrates a cross-sectional view of an exemplary embodiment of an optocoupler of the present invention having a transmitter chip 1 and a light-detecting semiconductor receiver chip 2. The transmitter chip 1 and the receiver chip 2 are electrically-insulated from each other via an optocoupling medium and are firmly joined together with the transmitter located above the receiver.

The optocoupling medium is formed of a transparent insulating layer 4, a transparent structured spacer layer 5, and a transparent connecting layer 3. The transparent insulating layer 4 is applied on top of the receiver chip 2. The transparent structured spacer layer 5 of electrically insulating material is applied on top of the transparent insulating layer 4. The transparent or light-transmissive connecting layer 3 fills out the interspaces or gaps in the structured spacer layer 5 and firmly joins the transmitter chip 1 to the receiver chip 2.

In one preferred exemplary embodiment of the present invention, the transmitter chip 1 is a GaAs IRED and the receiver chip is a Si photo-transistor. The connecting layer 3 is preferably composed of a transparent adhesive. Alternately, a glass solder can also be used as the connecting medium. The transparent insulating layer 4 that is applied on the receiver chip 2 is preferably either an $SiO_2$ layer, an $Al_2O_3$ layer or an $Si_3N_4$ layer. The structured spacer layer 5 is desirably composed of a light-transmissive polyimide.

In a preferred embodiment, the spacer layer 5 is comprised of a ridge structure. In such a structure, a plurality of ridges are preferably provided which proceed radially outward from a ridge-free inner or central region of the surface of the insulating layer 4 located in the region of the light sensitive surface of the receiver chip 2. The ridges discharge into an outer edge region or alternatively are surrounded by an edge ridge 5.

The transmitter chip 1, or in an embodiment with a plurality of transmitter chips, each chip is preferably glued on the wafer that contains the corresponding receiver chip. The transmitter chip is glued so that its emitter light exit face is opposite the chip contact side having contacts 8, 9 and is joined via the optical coupling medium 3, 4, 5 on the photo-sensitive surface of the receiver chip 2. The spacing between the transmitter chip 1 and the receiver chip 2 is thereby desirably maintained below 100 μm, and is held within extremely low tolerances by the spacer layer 5. The narrow spacing between the transmitter and the receiver is particularly advantageous and allows the optical coupler to achieve high coupling factors without also requiring a high dielectric strength which may be as high as 2.5 kV. The structural size of the optical coupler therefore also is physically small due to the design of gluing the transmitter chip 1 and receiver chip 2 on top of each other.

This design eliminates cross-talk when multiple couplers are incorporated into a single unit. Furthermore, the coupling elements can be integrated into a tightly packed housing which may be designed to be SMT-compatible. This simple structure also provides a structure which can be easily manufactured with a low cost procedure.

In one preferred exemplary embodiment, an IR transmission diode is employed as the transmitter chip 1, the optical emission from this chip which is at the pn-junction 6 is coupled out via the backside of the chip. Both of the contacts, the p contact 8 and the n contact 9, are located on the front side of the transmitter chip 1 that is manufactured in planar technology in a preferred embodiment. The chip thickness of the transmitter chip 1 is desirably kept below 120 μm. The transmitter chip 1 has a smaller area in the transition region where it is attached to the coupling medium 3, 4 and 5 such that the photo-sensitive area of the receiver chip 2 is matched to the emission characteristics of the transmitter chip 1.

A Si phototransistor is employed as the receiver chip 2. The receiver chip 2 is covered with either an $Al_2O_3$ layer, an $Si_3N_4$ layer or with an $SiO_2$ layer in order to increase the insulating characteristics. The insulating layer 4 is part of the coupling medium and is transparent so that the radiation emitted by the transmitter chip 1 may pass through to the receiver chip. The spacing between the transmitter chip 1 and the receiver chip 2 is defined by the spacer layer 5 that is constructed as a structured insulating layer, and is preferably a polyimide layer on the insulating layer 4. The size of the photo-sensitive area of the receiver chip 2 or of the pn-junction 7 thereof which defines this area is matched to the transmission characteristics of the optical radiation generated at pn-junction 6 of the transmitter chip 1. The collector contact 11 of the receiver chip 2 is designed to be surface-wide at the back chip side facing away from the photo-sensitive surface. The base contact 10 and an emitter contact (not shown) that are arranged offset relative to the base contact 10 are located on the front chip side of the receiver chip 2. The pad design is realized such that the contact connections or bond wires proceed laterally outward from the contacts 8, 9, 10 in order to achieve the highest insulating strength for the optical coupler.

The present invention is subject to many variations modifications and changes in detail. It is intended that all matter described throughout the specification an shown in the accompanying drawings be considered illustrative only. Accordingly, it is intended that the invention be limited only by the spirit scope of the appended claims.

We claim:

1. An optocoupler, comprising:

a light-emitting semiconductor transmitter chip;

a light-detecting semiconductor receiver chip adjacent to the transmitter chip;

a coupling medium comprising a transparent insulating layer for increasing the insulating strength of the optocoupler, a transparent structured spacer layer defining a spacing between the transmitter chip and the receiver chip, and a transparent connecting layer joining the transmitter chip to the receiver chip;

said transparent insulating layer being applied on top of the receiver chip completely over the region of the light sensitive surface of the semiconductor receiver chip so that radiation emitted by the transmitter chip passes through the transparent insulating layer to the receiver chip;

said transparent structured spacer layer being applied on top of said transparent insulating layer between the light-emitting semiconductor transmitter chip and the light-detecting semiconductor receiver chip having a structure defining interspaces between the light emitting semiconductor transmitter chip and the transparent insulating layer; and said transparent connecting layer being secured to the light-emitting semiconductor transmitter chip and located within the interspaces of the transparent structured spacer layer.

2. The optocoupler of claim 1, wherein the connecting layer is a transparent adhesive.

3. The optocoupler of claim 1, wherein the transparent insulating layer is comprised of silicon oxide.

4. The optocoupler of claim 1, wherein the transparent insulating layer is comprised of aluminum oxide.

5. The optocoupler of claim 1, wherein the transparent insulating layer is comprised of silicon nitride.

6. The optocoupler of claim 1, wherein the structured spacer layer is comprised of polyimide.

7. The optocoupler of claim 1, wherein the structured spacer layer is a ridge structure.

8. The optocoupler of claim 1, wherein the light-emitting transmitter chip has a light exit face opposite a chip contact side which is connected to a photosensitive area of the light-detecting semiconductor receiver chip via an optical coupling medium.

9. The optocoupler of claim 1, wherein the light-emitting semiconductor transmitter chip is smaller in a transition region where the transmitter chip is attached to the transparent connecting layer and spacer layer, respectively, than the light-detecting semiconductor receiver chip to facilitate a matching of a photosensitive area of the light-detecting semiconductor receiver chip to an emission characteristic of the light-emitting semiconductor transmitter chip.

10. The optocoupler of claim 1, wherein the transparent structured spacer layer defines a spacing between the transmitter and receiver chip which is less than 100 μm.

11. The optocoupler of claim 1, wherein the transparent insulating layer does not have any electrodes located therein.

* * * * *